(12) United States Patent
Moon et al.

(10) Patent No.: US 6,303,404 B1
(45) Date of Patent: Oct. 16, 2001

(54) METHOD FOR FABRICATING WHITE LIGHT EMITTING DIODE USING INGAN PHASE SEPARATION

(76) Inventors: Yong Tae Moon; Dong Joon Kim; Keun Man Song; Seong Ju Park, all of 1, Oryong-dong Buk-ku, Kwangju City (KR)

( * ) Notice: Subject to any disclaimer, the term of this patent is extended or adjusted under 35 U.S.C. 154(b) by 0 days.

(21) Appl. No.: 09/322,393

(22) Filed: May 28, 1999

(51) Int. Cl.$^7$ .................................................... H01L 21/00
(52) U.S. Cl. ............................. 438/46; 438/47; 438/796
(58) Field of Search ............................... 438/46, 47, 22, 438/796

(56) References Cited

U.S. PATENT DOCUMENTS

| 5,310,602 | * | 5/1994 | Li et al. . | |
|---|---|---|---|---|
| 5,633,200 | * | 5/1997 | Hu | 438/653 |
| 5,851,905 | * | 12/1998 | McIntosh et al. | 438/492 |
| 5,959,307 | * | 9/1999 | NaKamura et al. | 257/14 |

FOREIGN PATENT DOCUMENTS

| 406196757 | * | 7/1994 | (JP) . |
| 410289877 | * | 10/1998 | (JP) . |
| 411074621 | * | 3/1999 | (JP) . |

OTHER PUBLICATIONS

R. Schur, et al., "Observation of Spinodal Phase . . . Growth Temperatures", Jul. 97, pp. 87–89.*
C. A. Tran, et al., "Phase Separation . . . Low Pressure MOCVD", pp. 29–30.*

* cited by examiner

Primary Examiner—Long Pham
(74) Attorney, Agent, or Firm—Michael I. Chakansky

(57) ABSTRACT

Disclosed is a method for fabricating a white LED which comprises, as a single active layer, an InGaN thin film which enables emission of white light. The InGaN thin film is constructed by taking advantage of the spinodal decomposition of the ternary compound and rapid thermal annealing. When growing the InGaN thin film on an n-type GaN formed on a sappier substrate under a growth condition, the thin film undergoes spinodal decomposition into two phases which show photoluminescence of a wavelength range from violet to blue and from green to blue, respectively, after which the surface of the thin film is thermally stabilized by rapid thermal annealing and the photoluminescence of the In-deficient phase is improved, so as to give intensive white photoluminescence to the InGaN single active layer. The LED which recruits such a single active InGaN thin film is superb in light emission efficiency and can be fabricated in a significantly reduced process steps.

3 Claims, 2 Drawing Sheets

[Fig. 1]
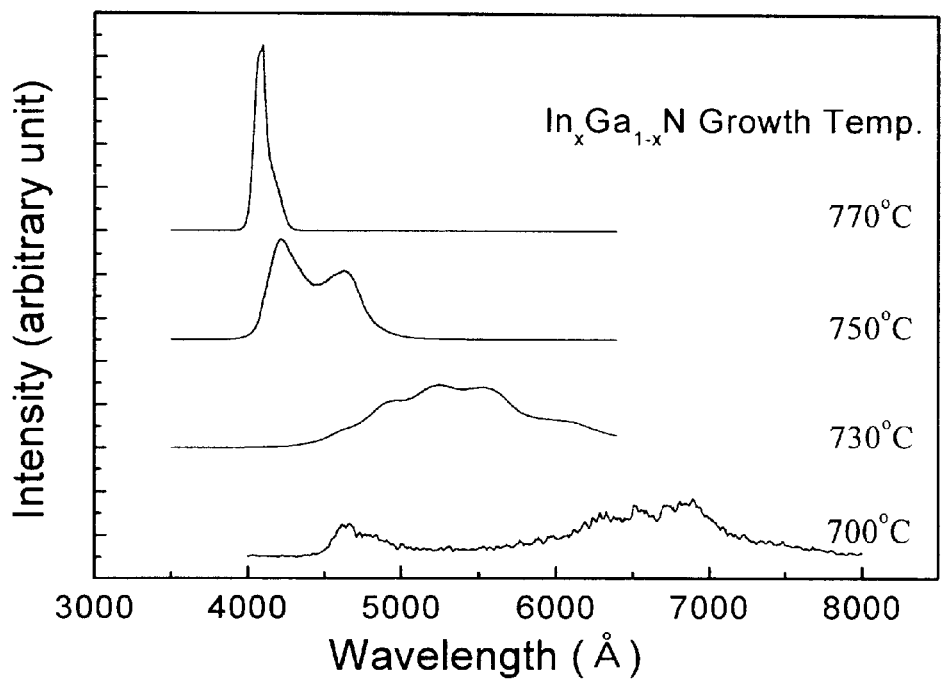
[Fig. 2]
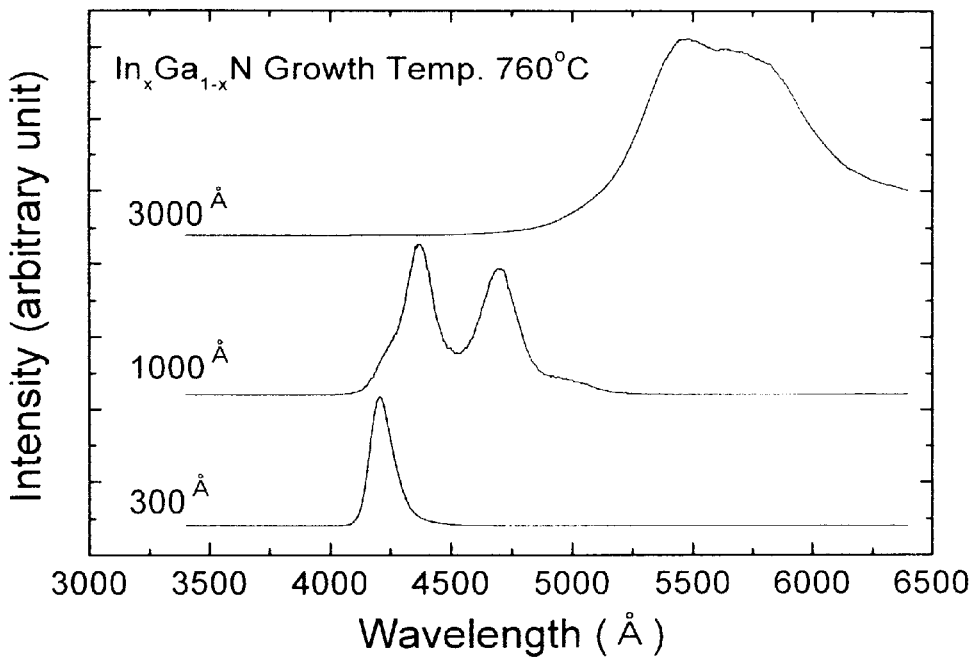

[Fig. 3]
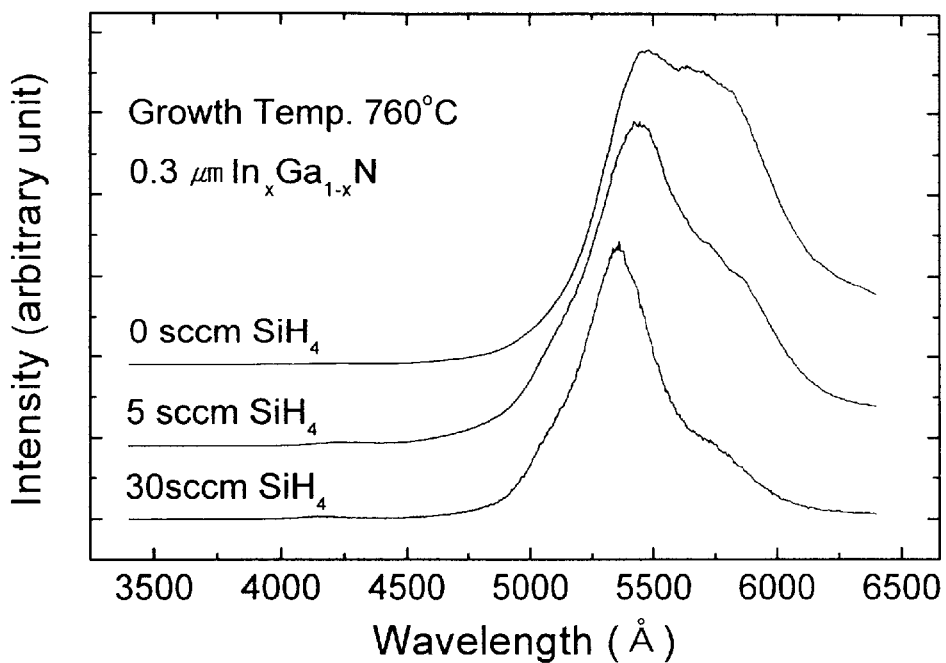
[Fig. 4]
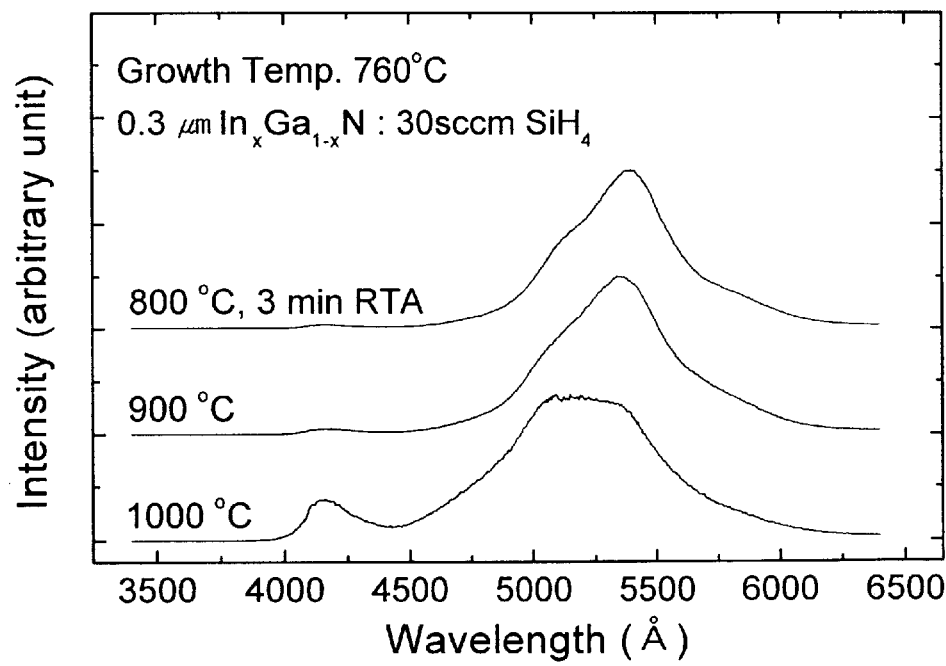

METHOD FOR FABRICATING WHITE LIGHT EMITTING DIODE USING INGAN PHASE SEPARATION

BACKGROUND OF THE INVENTION

1. Field of the invention

The present invention relates, in general, to a method for fabricating a white light emitting diode (LED) which comprises an InGaN thin film as a single active layer and, more particularly, to the phase separation of the thin film upon its growth and the rapid thermal annealing (RTA) of the phase-separated thin film, so as to produce an active single layer capable of emission of intensive white light.

2. Description of the Prior Art

In order to emit white light, there are needed all the three primary colors of light. The most fundamental method to emit white light with LEDs is to combine three red, green and blue LEDs. This enables the emission of a white color comfortable to the human eyes in addition to being very efficient because the individual short wave LEDs can be independently controlled. This method, however, suffers from the disadvantages of being unfavorable economically and productively and being extremely limited in application range.

S. Nakamura reported a white LED in which a luminescent material such as phosphine is applied for a blue or UV short wave LED ("The Blue Laser Diode" pp. 216–219, 1997). This LED is operated in such a manner that the light with an energy sufficient to cause excitation, emit-ted from the blue or UV short wavelength LED, excites the luminescent material to effect light in a yellow wavelength range, thus emitting white light on the whole. This technique has been extensively studied in Japan and is now on the brink of commercialization. The recruitment of the luminescent material enjoys ease in fabricating the white LED. However, this technique is significantly disadvantageous in that the diode is poor in luminescent efficiency because the light coming from the short wavelength LED is partially absorbed in the luminescent material.

As an alternative to avoid the self-absorption, an LED is disclosed in Appl., Phys. Lett., 70, 2664, 1997, which uses a semiconducting conjugated polymer, instead of a luminescent material, in cooperation with a blue short wavelength LED. The semiconducting conjugated polymer shows an energy gap of 1–3 eV and has energy absorption edges which are separated sufficiently from the wavelength of the light emitted, so that its self light absorption is minimal. This technique is high in energy conversion efficiency and has such an advantage that the white color can be tunably expressed by using appropriate polymers and controlling their thickness. As in the luminescent material technique, the short wavelength diode is required to be additionally processed. Other disadvantages of this technique are that the white LED fabricated is low in luminescent efficiency and its use environment is severely restrained by the polymer employed.

Accordingly, the ultimately demanded device is a diode which directly emits white light from a single chip, just like the short wavelength LED, without any luminescent materials or semiconducting conjugated polymer. In fact, a single chip white LED which has a structure of metal-insulator-n type GaN was reported in Tech. Phys. Lett., 22, 441, 1996, by Drizhuk et al. According to the report, when an active insulating layer (I-region) which shows a high specific resistance at low temperatures, is grown on an n-type GaN layer, zinc (Zn) is doped in one layer while zinc (Zn) and oxygen (O) are doped in the other layer, so as to cause white light emission. Although enjoying an advantage of producing a white color without the aid of luminescent materials or polymers, this technique suffers from a significant disadvantage in that, since the white light is emitted from the defect level which is formed by the dopants in the I-region grown at low temperatures, the luminescent efficiency is too low to produce an economical benefit.

SUMMARY OF THE INVENTION

As a consequence of the intensive and thorough research on white LEDs, the present inventors found that spinodal decomposition, characteristic of the ternary compound InGaN, is utilized to separate an InGaN layer into two phases which show photoluminescence of a wavelength range from violet to blue and from green to blue, respectively and RTA is useful to thermally stabilize the InGaN layer, whereby the layer enables emission of intensive white light.

Therefore, it is an object of the present invention to overcome the above problems encountered in prior arts and to provide a method for fabricating a white LED which is superb in luminescent efficiency.

It is another object of the present invention to provide a method for fabricating a white LED, which is favorable economically and productively.

In accordance with the present invention, the above objects could be accomplished by providing a method for fabricating a nitride seimconductor-based white light emitting diode, in which an InGaN thin film is subjected to phase separation while growing under a growth condition and then, to rapid thermal annealing to give a single active layer to the white light emitting diode.

BRIEF DESCRIPTION OF THE DRAWINGS

The above and other objects, features and other advantages of the present invention will be more clearly understood from the following detailed description taken in conjunction with the accompanying drawings, in which FIG. 1 is a graph showing the photoluminescence and phase separation properties of a 0.1 μm InGaN thin film, depending on growth temperatures;

FIG. 2 is a graph showing the photoluminescence and phase separation properties of an InGaN thin film which is grown at a growth temperature of 760° C., depending on its thickness;

FIG. 3 is a graph showing the photoluminescence properties of the InGaN which is grown to 0.3 μm at 760° C., depending on the flux rate of silane ($SiH_4$); and FIG. 4 is a graph showing the photoluminescence properties when the InGaN thin films, which are grown to 0.3 μm at 760° C. with silane ($SiH_4$) being added at a rate of 30 sccm, are subjected to RTA for 3 min at 800° C., 900° C. and 1,000° C.

DETAILED DESCRIPTION OF THE INVENTION

Typically, a white LED using a nitride semiconductor, in a single chip state, has a fundamental structure consisting of an n-type GaN layer, an InGaN-based active layer, and a p-type GaN layer In the active layer, the electrons donated from the n-type GaN combine with the holes provided from the p-type GaN to emit the light corresponding to the energy gap of the active layer material. Thus, in fabricating a white LED using a semiconductor, the core technique is how to grow an InGaN thin film, the active layer.

The active layer is assayed by a photoluminescence test, known as the most important and representative assay method. Usually, the photoluminescence is conducted for a specimen consisting of an n-type GaN layer and an InGaN active layer, lacking a p-type GaN layer. The term "active layer" as used herein, means an InGaN layer between an n-type GaN layer and a p-type GaN layer, the InGaN layer being narrower in energy gap than the n-type and the p-type GaN layers and showing photoluminescence.

InGaN, a ternary compound semiconductor, is a direct transition typed solid solution which can be prepared by mixing InN and GaN which are 1.9 eV and 3.4 eV in energy gap, respectively. That is, the introduction of indium can modulate the energy gap from 1.9 eV to 3.4 eV. However, since the difference in lattice constant between InN and GaN amounts to as large as about 11%, there exists a miscibility gap to a certain range in their mixture. In a miscibility gap area, the InGaN solid solution is so thermodynamically unstable that it spontaneously undergoes spinodal decomposition into two thermodynamically stable phases. This phase separation allows an In-rich phase to be distributed in a spatially random manner in an In-deficient matrix.

From a GaN-InN state diagram, the two phases which separate from each other at a growth temperature of 760° C. show indium contents amounting to about 22% and 80%. In the aspect of energy gap, the two phases having such indium contents can emit violet and red light, respectively. Another composition, which can be inferred from the state diagram, contains an indium content of about 44% as obtained in a parabolic binoidal decomposition curve. Corresponding to a meso-phase which is in a thermally metastable state, this composition can emit the light in a green wavelength range. Therefore, the present invention takes notice of the concept that, if the compositions of the separated phases are modulated by controlling the conditions for the growth of an InGaN thin film, a single active layer which is capable of emitting white light could be developed.

Below, details are given of the fabrication of a white LED according to the present invention.

Using a chemical vapor deposition (CVD) or molecular beam epitaxy (MBE) system, a thin film is grown on a (0001) sappier substrate. As a gallium source, trimethyl gallium (TMGa) or triethyl gallium (TEGa) is used while indium is taken from trimethyl indium (TMIn). In order to supply nitrogen, ammonia ($NH_3$) is used for the CVD system and nitrogen plasma for the MBE system. Silane ($SiH_4$) is employed for an n-type dopant, bicyclopentadienyl magnesium for an p-type dopant, and hydrogen $H_2$) or nitrogen ($N_2$) for carrier gas.

First, a GaN nucleation layer is grown at 500° C. on a (0001) sappier substrate by supplying the gallium source at a flux rate of 30–50 $\mu$mol/min with a Group V (nitrogen) source/Group III (gallium) source ratio ranging from 3,000 to 8,000. Then, the temperature of the substrate is elevated to 800–1,050° C. and maintained for 30 min to 2 hours to grow an n-type GaN layer under the condition that source supply is done for trimethyl gallium at a flux rate of 100–120 $\mu$mol/min and for the silicon source at a flux rate of 20–40 sccm with a Group V (nitrogen) scurce/Group III (gallium) source ratio ranging from 2,000 to 7,000.

Next, under the condition that the Group V (nitrogen) source/Group III (gallium) source ratio is increased to 9,000–12,000 and trimethyl indium is provided at a flux rate of 30–80 sccm with the flux ratio of the In source/(In source+Ga source) ranging 0.1 to 0.4, an InGaN thin film is grown at a growth rate of 0.1–0.5 $\mu$m/hour at a substrate temperature of 450–850° C. at a pressure of 200–250 torr, followed by conducting an RTA process at 500–1,100° C. for 0.1–30 min at a pressure of 0.1–760 torr in a nitrogen or ammonia atmosphere.

Subsequently, after the temperature of the substrate is adjusted to 800–1,050° C., trimethyl gallium and the p-type dopant source, $Cp_2Mg$, are supplied at a flux rate of 100–120 $\mu$mol/min and 1.0–2.5 $\mu$mol/min with a Group V (nitrogen) source/Group III (gallium) source ratio ranging from 2,000 to 7,000, so as to grow a p-type GaN layer to a thickness of 0.2–1.5 $\mu$m.

The InGaN thin film thus obtained has a multi-quantum well structure comprising InGaN/In$_x$Al$_y$Ga$_{1-x-y}$N ($0 \leq x$, $y \leq 1$). The multi-quantum well structure is formed by repetitively growing In$_x$Ga$_{1-x}$N active wells of relatively narrow energy gap and In$_y$Ga$_{1-y}$N (x>y) barrier layers of relatively wide energy gap in an alternative manner. This simple stack of the active layers renders luminescence brighter. Like this, the thin film preoared by repetitively growing the active well layers and the barrier layers alternatively, is referred to as "InGaN/In$_x$Ga$_{1-x}$N ($0 \leq x \leq 1$) multi-quantum wells (MQWs)".

In the case of the multi-quantum well structure, the InGaN active well is grown to a thickness of 2–30 nm and the InAlGaN barrier to a thickness of 7–10 nm with TMAl serving as an aluminum source.

Now, the photoluminescence properties of the InGaN thin films grown on an n-type GaN layer under the conditions controlled to cause phase separation and the photoluminescene properties of the phase-separated InGaN thin films after RTA, will be described in conjunction with the drawings.

With reference to FIG. 1, there are shown the photoluminescence properties of the InGaN thin films which are grown to 0.1 $\mu$m at various temperatures ranging from 700 to 770° C. This graph shows that, as the temperature decreases, the peaks are shifted from a UV region to an infrared region. Also, it is recognized from the graph that phase separation begins at 750° C. or less and the luminescence intensity is reduced at 730° C. or less. This result is attributed to the fact that larger amounts of InN, characteristic of a high vapor pressure, are incorporated in the thin film as the growth temperature is decreasingly low and ammonia, serving as a Group V element source, shows low thermal decomposition property at low temperatures.

With reference to FIG. 2, there are shown the photoluminescence properties of the InGaN thin films which are grown to a thickness from 300 Å to 0.3 $\mu$m at a growth temperature of 760° C. As seen, a single peak with a violet wavelength is read from the InGaN thin film 300 Å thick. When the thickness increases to 0.1 $\mu$m, separated peaks appear. The InGaN thin film 0.3 $\mu$m thick emits light with a broad range of wavelengths from green to red.

Turning to FIG. 3, there are shown the photoluminescence properties of the InGaN which is grown to 0.3 $\mu$m at 760° C. with addition of silane ($SiH_4$) at various concentrations. The doped silicon improves the surface properties of the thin film, increasing the number of the electrons responsible for photoluminescence.

Finally, referring to FIG. 4, there are shown the photoluminescence properties when the InGaN thin films which are grown to 0.3 $\mu$m at 760° C. with silane ($SiH_4$) being added at a rate of 30 sccm, are subjected to RTA for 3 min at 800° C., 900° C. and 1,000° C. As shown, when the film underwent RTA at 800° C. or 900° C., a peak was read in a green wavelength region. At 1,000° C., the peak is broadened in a trapezoidal shape to a violet wavelength region, resulting in luminescence over the overall wavelength range of the visible light. That is, bright white light can be emitted.

A better understanding of the present invention may be obtained in light of the following examples which are set forth to illustrate, but are not to be construed to limit the present invention.

In the following examples, thin film growth was done on a (0001) sappier substrate by a metalorganic chemical vapor deposition (MOCVD) process. In this regard, trimethyl gallium, trimethyl indium, and ammonia were used as sources for gallium, indium and nitrogen, respectively. Being carried by 30 sccm of hydrogen, silicon served as an n-type dopant.

EXAMPLE I

A nucleation layer was grown at 500° C. to 300 Å using trimethyl gallium and ammonia at an amount of 41 μmol/min and 8,500 sccm, respectively. Then, using trimethyl gallium and ammonia at an amount of 106 μmol/min and 8,500 sccm, respectively, epitaxial growth was conducted at 1,020° C. for 1 hour to produce an n-type GaN epi-layer 1.8 μm thick. Next, while supplying trimethyl indium at an amount of 33 sccm with 0.25 for an amount ratio of In source/(In source+Ga source) and 10,000 for an amount ratio of Group V source/Group III source, an InGaN thin film was grown at a growth rate of 0.3 μm/h for 20 min under 200 torr at various temperatures from 450° C. to 850° C.

EXAMPLE II

An n-type GaN layer was grown in the same manner as in Example I. After the substrate was cooled to 760° C., an InGaN thin film was grown to a thickness from 2 nm to 1,000 nm under the same condition as in Example I.

EXAMPLE III

An n-type GaN layer was grown in the same manner as in Example I. After the substrate was cooled to 760° C., an InGaN thin film was grown to 0.3 μm under the same condition as in Example I, except for supplying silane ($SiH_4$) at amounts from 0 sccm to 200 sccm.

EXAMPLE IV

An n-type GaN layer was grown in the same manner as in Example I. After the substrate was cooled to 760° C., an InGaN thin film was grown to 0.3 μm under the same condition as in Example I, except for supplying silane ($SIH_4$) at an amount of 30 sccm. This InGaN thin film was subjected to RTA at a temperature from 500 to 1,100° C. for a time from 0.1 to 30 min under a pressure from 0.1 torr to 760 torr in a combined atmosphere of nitrogen and ammonia.

EXAMPLE V

An n-type GaN layer was grown in the same manner as in Example I. After the substrate was cooled to 730° C., an InGaN active well was grown to 10 nm using 11 μmol/min of trimethyl gallium, 8,500 sccm of trimethyl indium and 10 μmol/min of trimethyl indium. Over this active well was grown a 10 nm thick barrier by supplying 20 μmol of trimethyl gallium and 8,500 sccm of ammonia. This well and barrier structure was repetitively constructed four times further. Next, on the resulting structure, a barrier was grown to 3 nm using 15 μmol/min of trimethyl gallium, 8,500 sccm of ammonia and 5 μmol/min of trimethyl aluminum, after which a 3 nm InGaN well was formed on this barrier by elevating the temperature of the substrate to 760° C., followed by the growth of a GaN barrier to 7 nm on the InGaN well. This well and barrier growth was repetitively conducted twice further, to allow a ternary multi-quantum well structure.

As described hereinbefore, the LED prepared by the method of the present invention can emit highly intensive white light from a single chip without any luminescent material or semiconducting conjugated polymer. In addition to improving the luminescent efficiency of the white LED, being free from the employment of such a luminescent material or polymer significantly reduces the number of the manufacturing process steps of LED, bringing about an economical benefit. Further, because the environmental restraint attributable to the use of such a luminescent material or polymer is removed, the white LED using nitride semiconductors, according to the invention, can be applied in a broad range of fields.

The present invention has been described in an illustrative manner, and it is to be understood the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method for fabricating a nitride semiconductor-based white light emitting diode using InGaN phase separation, in which an InGaN thin film is subjected to phase separation while growing under a growth condition and then, to rapid thermal annealing to become an active layer which emits white light in the white white light emitting diode without phosphor materials, wherein the phase separated InGaN thin film which emits white light is grown to a thickness of 2 nm–300 nm at a temperature of 450–850° C. by a chemical vapor deposition process or a molecular beam epitaxy process using silane ($SiH_4$) at an amount of 3–100 sccm as an n-type dopant source.

2. A method of fabricating a nitride semiconductor-based white light emitting diode having a single active layer, i.e., an InGaN thin film which emits white light, the method comprising:

(a) growing an n-type GaN thin film on a substrate;

(b) growing a phase-separated InGaN thin film which is grown to a thickness of 7.1–200 nm at a temperature of 450–850° C. by a metalorganic chemical vapor deposition process or a molecular beam epitaxy process using silane ($SiH_4$) at an amount of 3–100 sccm as an n-type dopant source, the phase-separated InGaN thin film emitting white light;

(c) annealing the InGaN thin film thermally at a temperature of 700–1050° C. for 0.1–10 min in a nitrogen ($N_2$) or ammonia ($NH_3$) atmosphere; and (d) growing a p-type GaN layer on the InGaN thin film.

3. A method as set forth in claim 1, wherein the phase-separated InGaN thin film which emits white light has a multi-quantum well structure comprising phase-separated $InGaN/In_xAl_yGa_{1-x-y}N$ ($0 \leq x, y \leq 1$) multi-quantum wells.

* * * * *